(12) United States Patent
Huang (10) Patent No.: US 7,250,362 B2
(45) Date of Patent: Jul. 31, 2007

(54) SOLDER BUMP STRUCTURE AND METHOD FOR FORMING THE SAME

(75) Inventor: Min-Lung Huang, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/936,569

(22) Filed: Sep. 9, 2004

(65) Prior Publication Data
US 2005/0054154 A1  Mar. 10, 2005

(30) Foreign Application Priority Data
Sep. 9, 2003    (TW) ................. 92124858 A (51) Int. Cl.
*H01L 21/44* (2006.01)
*H01L 21/4763* (2006.01)
*H01L 21/48* (2006.01)
*H01L 21/50* (2006.01)

(52) U.S. Cl. ............ 438/612; 438/108; 438/637; 438/613

(58) Field of Classification Search ........ 438/612, 438/613, 638, 637, 108, 125
See application file for complete search history.

(56) References Cited
U.S. PATENT DOCUMENTS

| | | | |
|---|---|---|---|
| 6,278,184 B1 | 8/2001 | Jackson et al. | |
| 6,299,220 B1 | 10/2001 | Bacher et al. | |
| 6,372,622 B1 * | 4/2002 | Tan et al. | 438/612 |
| 6,392,163 B1 | 5/2002 | Magill et al. | |
| 6,578,755 B1 | 6/2003 | Elenius et al. | |
| 6,593,220 B1 * | 7/2003 | Yu et al. | 438/612 |
| 6,630,736 B1 | 10/2003 | Ignaut et al. | |
| 6,664,128 B2 | 12/2003 | Su et al. | |
| 6,707,137 B2 | 3/2004 | Kim | |
| 6,707,153 B2 | 3/2004 | Hanaoka et al. | |
| 6,849,534 B2 * | 2/2005 | Ho et al. | 438/614 |
| 6,878,633 B2 * | 4/2005 | Raskin et al. | 438/694 |

* cited by examiner

*Primary Examiner*—Chuong A. Luu
(74) *Attorney, Agent, or Firm*—Birch, Stewart, Kolasch & Birch, LLP (57) ABSTRACT

A method for forming a solder bump structure with increased height. A substrate having at least one metal bonding pad thereon is provided. A passivation layer is formed on the substrate, which substantially exposes the metal bonding pad. An under ball metallurgy (UBM) layer is formed on the exposed metal bonding pad. A dielectric layer and a resist layer are successively formed on the passivation layer, wherein the dielectric layer has a first opening to expose the UBM layer and the resist layer a second opening over the first opening. A solder bump is formed on the UBM layer in the first and second openings, and the resist layer is then removed.

15 Claims, 7 Drawing Sheets

SOLDER BUMP STRUCTURE AND METHOD FOR FORMING THE SAME

This Non-provisional application claims priority under 35 U.S.C. § 119(a) on Patent Application No(s). 92124858 filed in Taiwan, Republic of China on Sep. 9, 2003, the entire contents of which are hereby incorporated by reference.

BACKGROUND

The invention relates to a bumping process for semiconductor packaging and in particular to a solder bump structure with improved height and a method for forming the same.

Packaging is an essential step in the fabrication of integrated circuits, which protects the integrated circuits and provides a signal transmission interface for external circuits. Therefore, the development of packaging is affected by the development of integrated circuit technology and the function of electronic products.

A variety of packaging technologies have been developed, such as ball grid array (BGA), chip scale package (CSP), flip chip, and multi-chip module (MCM). In particular, flip chip is a commonly used packaging method, which employs a solder bump formed on a bonding pad for connection to the circuit board. The formation of the solder bump comprises solder ball mounting, printing, and electroplating.

Figure 1A:
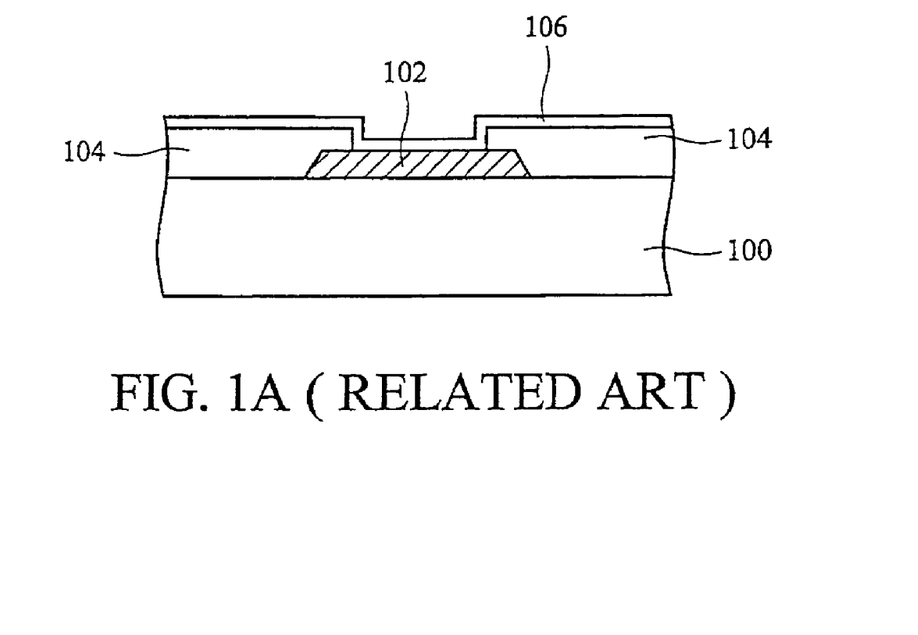
FIGS. 1A to 1D are cross-sections of a conventional method for forming a solder bump structure by electroplating.

FIGS. 1A to 1D illustrate a conventional method for forming a solder bump structure by electroplating. As shown in FIG. 1A, a substrate 100, such as a silicon substrate, is provided. The substrate 100 has a metal bonding pad 102 comprising, for example, aluminum or copper. A passivation layer 104, such as a silicon nitride layer, is formed overlying the substrate 100 and substantially exposes the metal bonding pad 102. A metal composite layer 106 is conformably formed on the passivation layer 104 and the exposed metal bonding pad 102, which is typically a metal stack of adhesion layer/barrier layer/wetting layer. In order to simplify the diagram, a single layer is depicted.

Figure 1B:
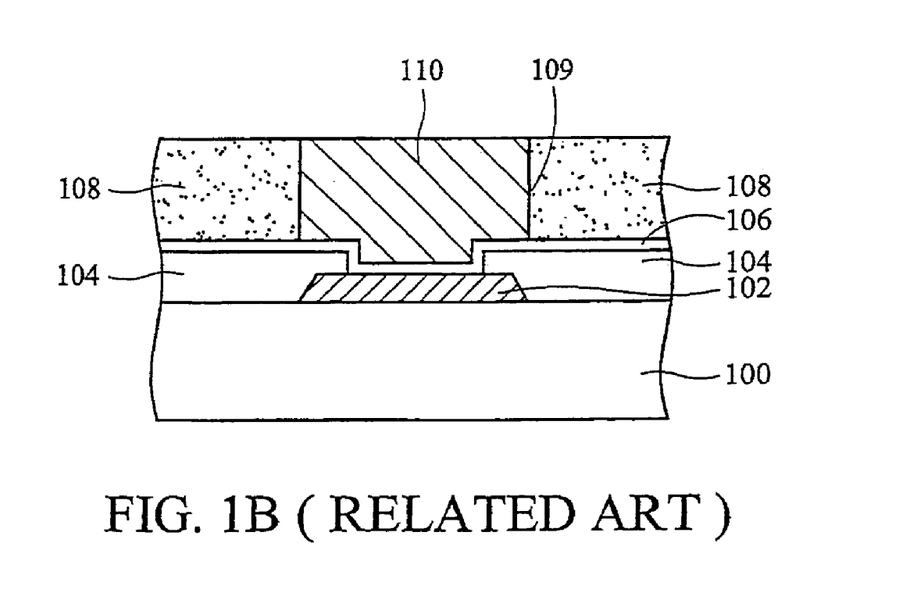

As shown in FIG. 1B, a dry pattern film 108 is formed on the metal composite layer 106, which has an opening 109 to expose a portion of the metal composite layer 106 overlying the metal bonding pad 102. Here, the opening region 109 is utilized in forming solder bump. Accordingly, the opening 109 is subsequently filled with a solder 110 by electroplating. The height of the solder is determined by the thickness of the dry pattern film 108.

Figure 1C:
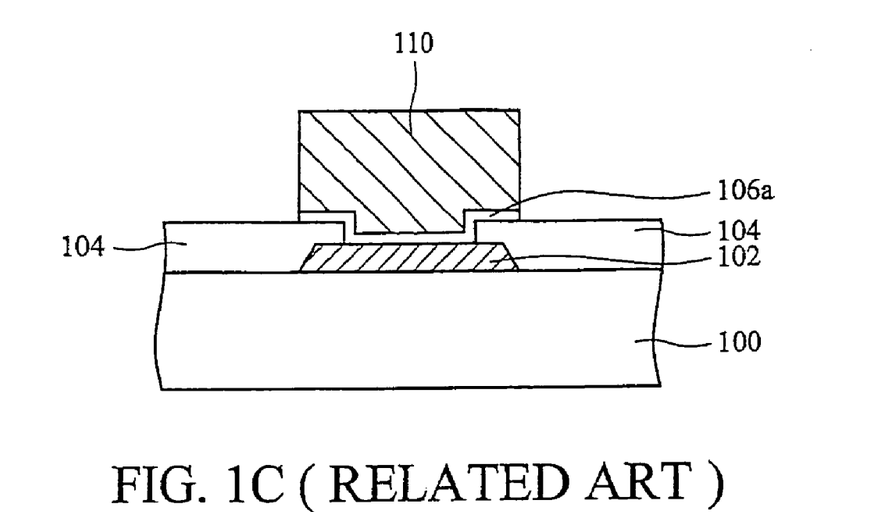

As shown in FIG. 1C, the dry pattern film 108 is removed and the metal composite layer 106 uncovered by the solder 110 is then removed, exposing the underlying passivation layer 104. The remaining metal composite layer 106a acts as an under bump metallurgy (UBM) layer.

Figure 1D:
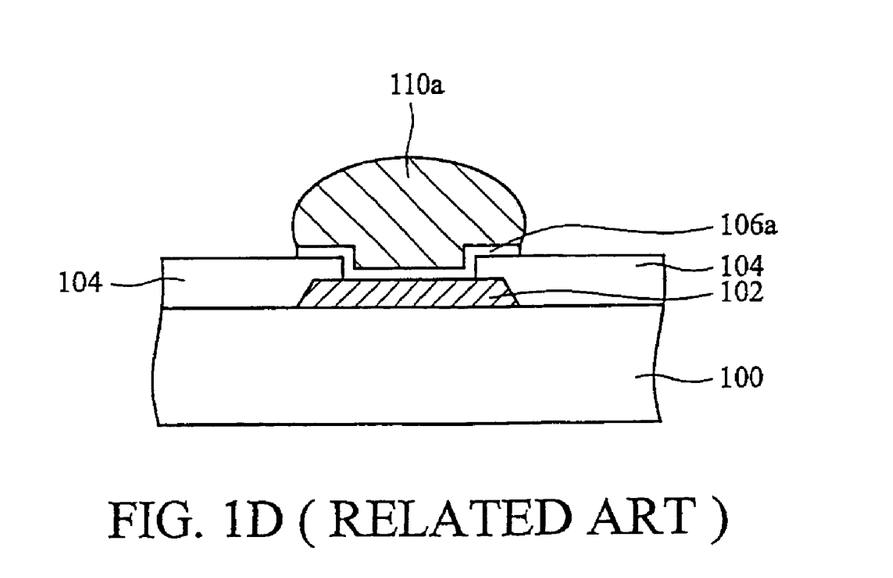

As shown in FIG. 1D, a reflow process is performed, such that the solder 110 forms a ball-shaped or hemiball-shaped solder bump 110a due to surface tension.

The height of the solder bump, however, affects reliability of packaging devices. As the size of the package is reduced, fatigue strength is degraded if the height of the solder bump is too low, reducing the bonding life. Moreover, during bonding the chip to the circuit board, the gap between the chip and the circuit board cannot be effectively filled with the underfill, thus forming holes therein.

Accordingly, the reliability of the flip chip method can be increased by providing higher solder bump. Generally, the methods for increasing the height of the solder bump are to increase the dry film thickness or size of the UBM layer, thereby increasing the capacity of the solder to accomplish the higher solder bump. Unfortunately, such methods may be detrimental for lithography or increase the occupied area of the chip, reducing the integration.

Figure 2:
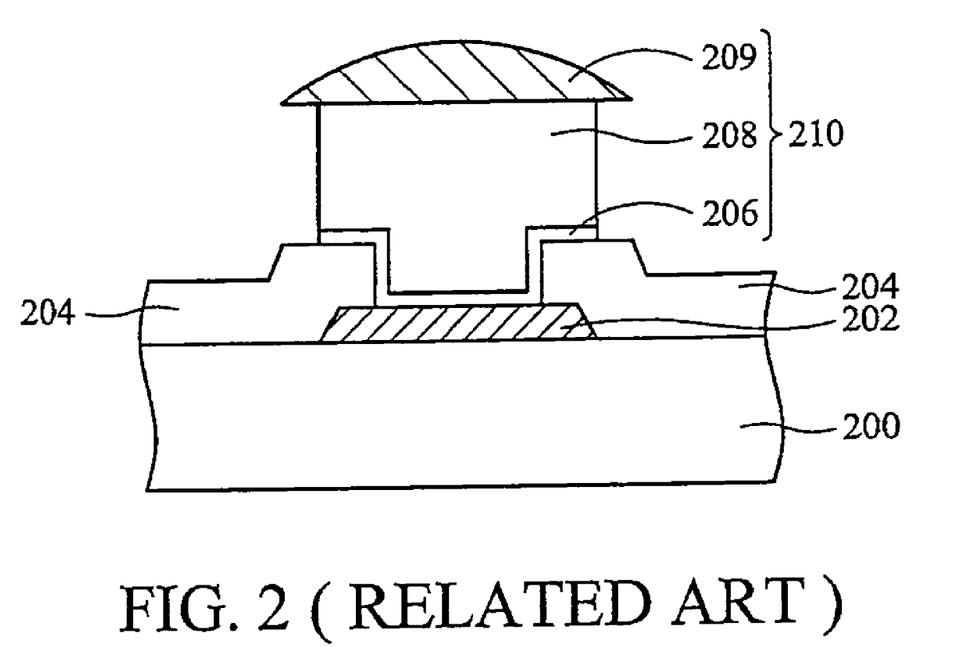
FIG. 2 illustrates a solder bump structure of the related art.

Taiwan Patent No. 90,117,002 discloses a method of flip chip bonding which employs double photoresist layers with different reactive spectrum to provide a higher solder bump. In this, method, however, the solder bump may collapse easily during removal of the double photoresist layers, such that the height of the solder bump cannot be effectively increased. Additionally, U.S. Pat. No. 6,299,220 discloses a solder bump structure, as shown in FIG. 2. The solder bump structure comprises a substrate 200 having a bonding pad 202 and a passivation layer 204 thereon. A barrier layer 206 is disposed between the bonding pad 202 and the solder bump 210. Here, the solder bump 210 comprises a composite material. That is, the lower portion 208 of the solder bump 210 comprises a material with a relatively higher melting point and the upper portion 209 with a relatively lower melting point. When a reflow process is performed, the lower portion 208 of the solder does not melt thus preventing collapse of the solder bump, maintaining the height thereof. In this method, however, two materials are required, complicating the fabrication and increasing the cost.

SUMMARY

Embodiments of the invention provide a method for forming a solder bump structure. A substrate having at least one metal bonding pad thereon is provided. A passivation layer is formed on the substrate, which substantially exposes the metal bonding pad. An under ball metallurgy (UBM) layer is formed on the exposed metal bonding pad. A dielectric layer and a resist layer are successively formed on the passivation layer, wherein the dielectric layer has a first opening to expose the UBM layer and the resist layer a second opening over the first opening. After filling the first and second openings with a conductive material, a recess process is performed, such that the conductive layer forms a solder bump, and the resist layer is then removed.

The conductive layer may comprise tin and the UBM layer may further comprise titanium, chromium, nickel, vanadium, copper, aluminum, aurum, or alloys thereof.

Moreover, the dielectric layer may comprise polyimide and the resist layer may further comprise a dry film or a wet photoresist layer.

Additionally, the first and second openings constitute a T-shaped opening.

Embodiments of the invention further provide a solder bump structure. The structure comprises: a substrate, a passivation layer, an UBM layer, a dielectric layer, and a mushroom-shaped solder bump. The passivation layer is disposed on the substrate having at least one metal bonding pad thereon and substantially exposes the metal bonding pad. The UBM layer is disposed on the exposed metal bonding pad. The dielectric layer is disposed on the passivation layer and has an opening to expose the UBM layer. The mushroom-shaped solder bump is disposed in the opening and partially covers the dielectric layer.

The UBM layer may comprise titanium, chromium, nickel, vanadium, copper, aluminum, aurum, or alloys thereof, and the mushroom-shaped solder bump may further comprise tin.

Moreover, the dielectric layer may comprise polyimide. The portion of the mushroom-shaped solder bump covering the dielectric layer has a thickness of about 15% to 20% of total thickness thereof.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only and thus not intended to be limitative of the invention.

DETAILED DESCRIPTION

Figure 3A:
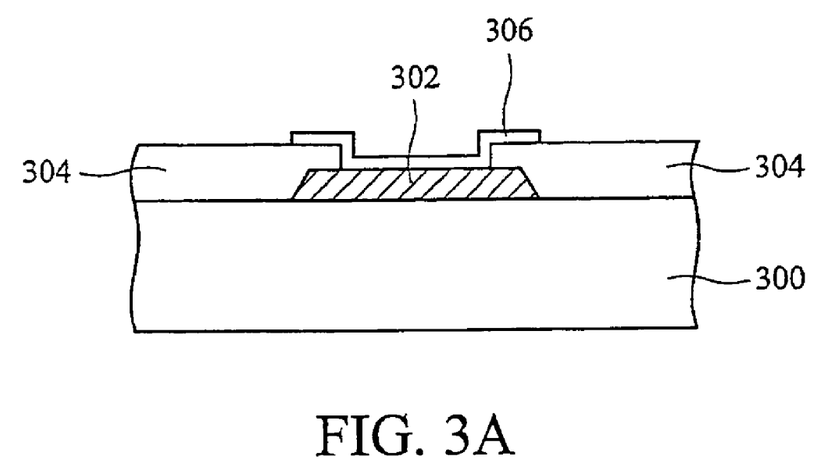
FIGS. 3A to 3E are cross-sections of a method for forming a solder bump structure of an embodiment of the invention.

FIGS. 3A to 3E illustrate a method for forming a solder bump structure of an embodiment of the invention. First, as shown in FIG. 3A, a substrate 300, such as a silicon chip or other semiconductor chip, is provided. The substrate 300 may contain a variety of elements, including, for example, MOS transistors, resistors, and other semiconductor elements as are well known in the art. The substrate 300 may also contain other insulating layers or metal interconnect layers. In order to simplify the diagram, a flat substrate is depicted. Here, the substrate 300 further comprises a metal bonding pad 302 thereon. Moreover, the metal bonding pad 302 comprises aluminum or copper. The substrate 300 is subsequently covered by a passivation layer 304 which substantially exposes the metal bonding pad 302. The passivation layer 304 may comprise polyimide (PI) or silicon nitride formed by plasma enhanced chemical vapor deposition (PECVD).

Thereafter, an under bump metallurgy (UBM) layer 306 is formed on the passivation layer 304 and the exposed metal bonding pad 302 by conventional deposition, such as sputtering or CVD. Generally, the UBM layer 306 may be multiple metal layers comprising an adhesion layer, a barrier layer, and a wetting layer. In order to simplify the diagram, only a single layer is depicted. The adhesion layer improves adhesion between the metal bonding pad 302 and the passivation layer 304. The barrier layer prevents diffusion of metal atoms. The wetting layer increases wetness with the subsequent solder bump and prevents the underlying metal bonding pad from oxidizing. In this embodiment, the UBM layer 306 may comprise titanium (Ti), chromium (Cr), nickel (Ni), vanadium (V), copper (Cu), aluminum (Al), aurum (Au), or alloys thereof. Preferably, the UBM layer 306 comprises Al/Ni-V alloy/Cu. Next, the UBM layer 306 is partially removed by lithography and etching to leave a portion of the UBM layer 306 overlying the metal bonding pad 302 and partially covering the passivation layer 304, as shown in FIG. 3A.

Figure 3B:
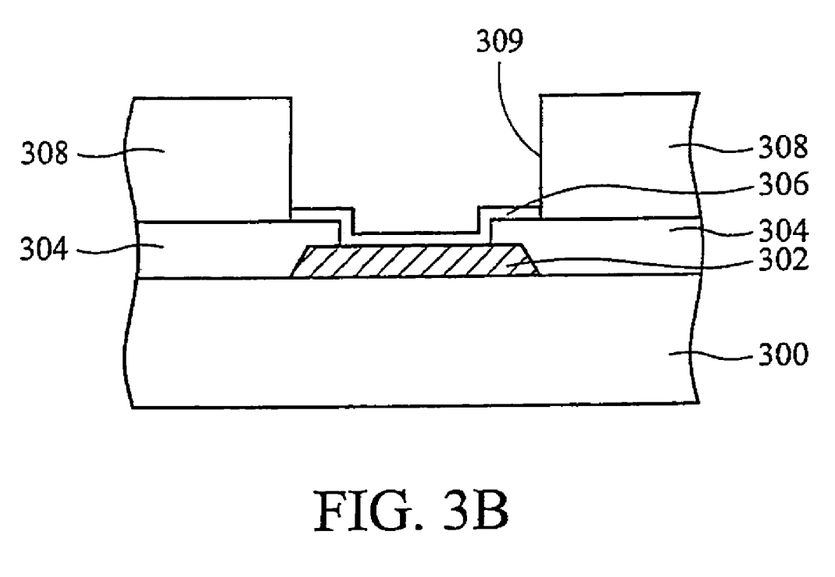
Figure 3C:
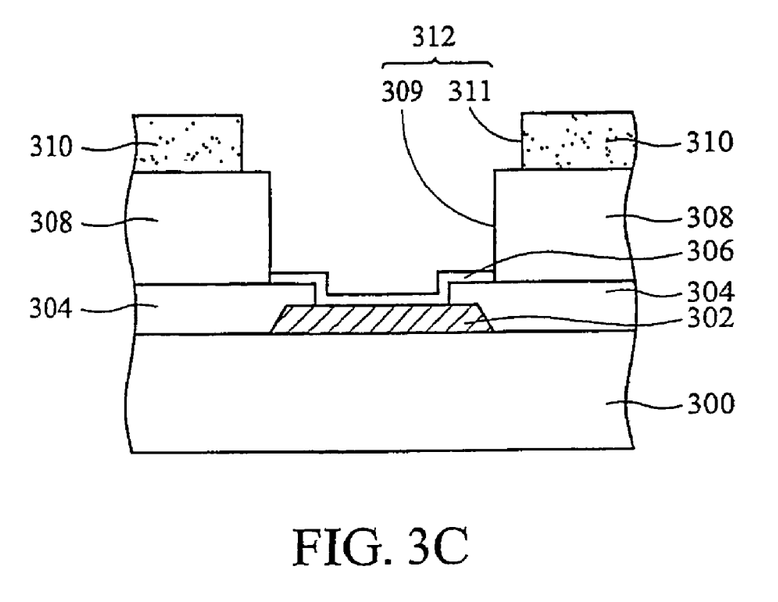

FIGS. 3B to 3C are critical steps of an embodiment of the invention. First, a dielectric layer 308 is formed on the passivation 304 and the remaining UBM layer 306. Thereafter, an opening 309 is formed in the dielectric layer 308 by lithography and etching, to expose the UBM layer 306, as shown in FIG. 3B. In the embodiment, the dielectric layer 308 may comprise light sensitive polymer, such as polyimide, which may form the opening 309 therein by lithography. A resist layer 310, such as a dry film or a wet photoresist layer, is subsequently formed on the dielectric layer 308. An opening 311 is also formed therein by lithography. In an embodiment of the invention, the width of the opening 309 may be substantially equal to or greater than the opening 311. Preferably, the width of the opening 309 is greater than the opening 311 to form a T-shaped opening 312, as shown in FIG. 3C.

Additionally, FIGS. 3B' to 3C' illustrate another example of formation of the opening 312. First, a dielectric layer 308 and a resist layer 310 are successively formed on the passivation 304 and the remaining UBM layer 306, as shown in FIG. 3B'. Here, the dielectric layer 308 and the resist layer 310 may respectively comprise polyimide and dry film. Thereafter, the opening 312 is formed in the resist layer 310 and the dielectric layer 308 by one or two lithography procedures. Preferably, the opening 312 is T-shaped, as shown in FIG. 3C'.

Accordingly, the thickness of the dielectric layer 308 can be increased to accomplish a higher solder bump in subsequent processes without increasing the thickness of the resist layer 310. Moreover, the solder structure can be strengthened by the dielectric layer 308, thereby tolerating greater shear stress in reliability testing.

Figure 3D:
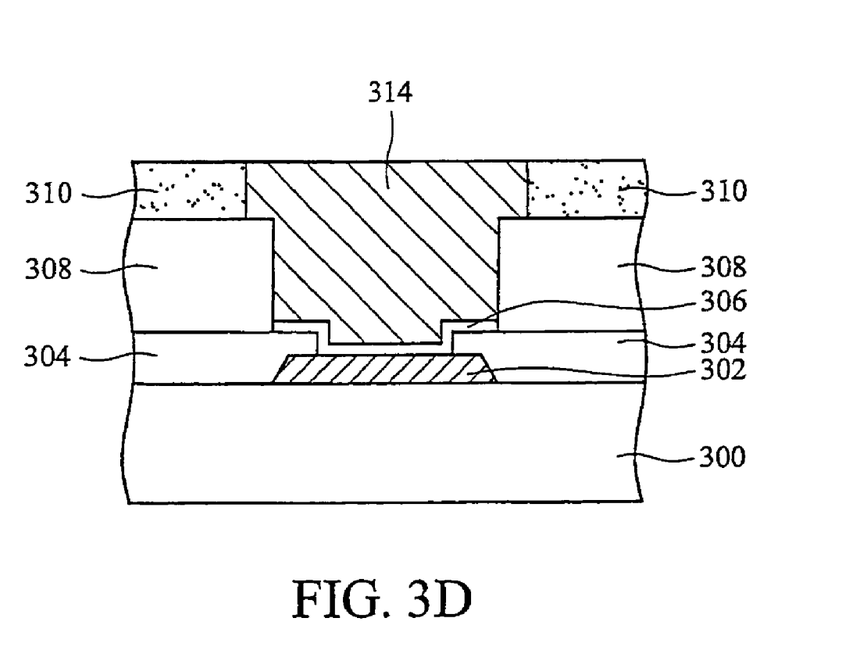

Next, as shown in FIG. 3D, the opening 312 is filled with a conductive layer 314, such as tin (Sn), SnPb, lead-free solder, or the like, by printing.

Figure 3E:
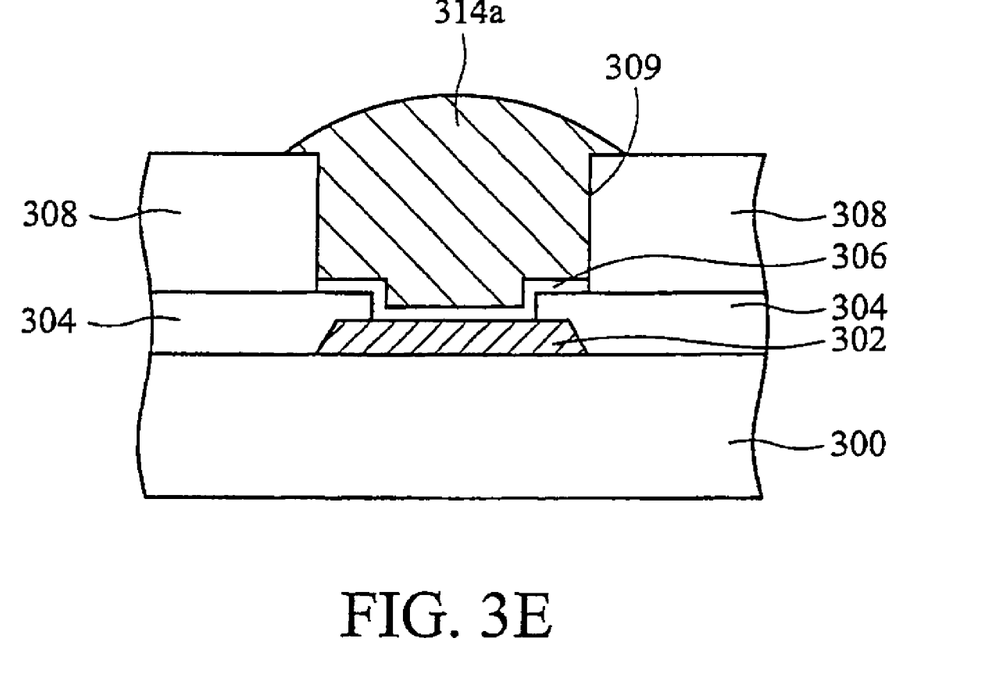

Finally, as shown in FIG. 3E, the resist layer 310 is removed to expose the underlying dielectric layer 308. A reflow process is subsequently performed, such that the conductive material 314 forms a mushroom-shaped solder bump 314a due to surface tension. Additionally, the reflow process may be performed firstly, such that the conductive material 314 forms a mushroom-shaped solder bump 314a, then the resist layer 112 is removed. In an embodiment of the invention, since the solder bump 314a is supported by the dielectric layer 308 to prevent the collapse of the solder bump 314a during the reflow process, the height of the solder bump 314a is maintained. Moreover, the dielectric layer 308 serves as a portion of the underfill, thereby reducing the content of the underfill in the subsequent encapsulation. Moreover, since the volume of the solder bump 314a may be determined by the thickness of the dielectric layer 308 and the resist layer 310, the height of the solder bump 314a can be increased without increasing the size of the UBM layer 306. That is, the height of the solder bump 314a can be controlled without affecting the size of the UBM layer 306 by adjusting the size and the depth of the opening 312, thereby preventing reduction of the integration.

FIG. 3E also illustrates a solder bump structure of an embodiment of the invention. The structure comprises: a substrate 300, a passivation layer 304, an UBM layer 306, a dielectric layer 308, and a mushroom-shaped solder bump 314a. The passivation layer 304 is disposed on the substrate 300 having at least one metal bonding pad 302 thereon and substantially exposes the metal bonding pad 302.

The UBM layer 306 is disposed on the exposed metal bonding pad 302 and partially covers the passivation layer 304, which comprises titanium (Ti), chromium (Cr), nickel (Ni), vanadium (V), copper (Cu), aluminum (Al), aurum (Au), or alloys thereof. The dielectric layer 308 is disposed on the passivation layer 304 and has an opening 309 exposing the UBM layer 306, which comprises light sensitive material, such as polyimide.

The mushroom-shaped solder bump 314a is disposed in the opening 309 and partially covers the dielectric layer 308, which may comprise tin (Sn), SnPb, lead-free solder, or the like. Moreover, the portion of the mushroom-shaped solder bump 314a covering the dielectric layer 308 has a thickness of about 15% to 20% of the total thickness thereof, such that the solder bump 314a provides sufficient volume for collapse when the solder bump 314a is mounted on the circuit board. Moreover, there are many ways for fabricating a solder bump, in which a mushroom-shaped solder bump 314a covering the dielectric layer 308 has a thickness of about 15% to 20% of the total thickness thereof. For example, the thickness of the dielectric layer is at least about twice the thickness of the resist layer as shown in FIG. 3D, so that the conductive material 314 after the reflow process is enough to stuff the opening surrounded by the dielectric layer 308 and even to form a mushroom-shaped solder bump 314a which protrudes from the top surface of the dielectric layer 314a and has a thickness of about 15% to 20% of the total thickness thereof.

According to embodiments of the invention, the height of the solder bump can be increased without increasing the size of the UBM layer or the thickness of the resist layer, preventing reduced integration, eliminating lithography limitations, and increasing reliability. Moreover, the dielectric layer around the solder bump can strengthen the solder bump structure and increase its height. Accordingly, the solder bump can be formed without requiring more than two different materials. The dielectric layer can further act as a portion of the underfill, reducing the content of the underfill in subsequent encapsulation. That is, simple fabrication and lower cost can be accomplished.

While the invention has been described by way of example and in terms of preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for forming a solder bump structure, comprising:
   providing a wafer having at least one metal bonding pad and a passivation layer thereon, wherein the passivation layer leaves the bonding pad exposed;
   forming an under ball metallurgy layer on the metal bonding pad;
   successively forming a dielectric layer and a resist layer on the passivation layer, wherein the dielectric layer has a first opening to expose the under ball metallurgy layer and the resist layer a second opening over the first opening;
   filling the first and second openings with a conductive layer by a printing process;
   forming a solder bump on the under ball metallurgy layer in the first and second openings by performing a reflow process on the conductive layer, during which the dielectric layer and the resist layer support the conductive layer and prevent from collapse; and
   removing the resist layer after the reflow process, such that the solder bump is substantially surrounded by the dielectric layer.

2. The method as claimed in claim 1, wherein the conductive layer comprises tin.

3. The method as claimed in claim 1, wherein the dielectric layer comprises light sensitive polymer.

4. The method as claimed in claim 1, wherein the dielectric layer comprises polyimide.

5. The method as claimed in claim 1, wherein the resist layer comprises a dry film.

6. The method as claimed in claim 1, wherein the resist layer comprises a wet photoresist layer.

7. The method as claimed in claim 1, wherein the first and second openings constitute a T-shaped opening.

8. A method for forming a solder bump structure, comprising:
   providing a wafer having at least one metal bonding pad and a passivation layer thereon, wherein the passivation layer leaves the bonding pad exposed;
   forming an under ball metallurgy layer on the metal bonding pad;
   successively forming a dielectric layer and a resist layer on the passivation layer, wherein the dielectric layer has a first opening to expose the under ball metallurgy layer and the resist layer a second opening over the first opening, and wherein the thickness of the dielectric layer is at least about twice the thickness of the resist layer;
   filling the first and second openings with a conductive layer;
   forming a mushroom-shaped solder bump on the tinder ball metallurgy layer in the first and second openings by performing a reflow process on the conductive layer; and
   removing the resist layer, such that the solder bump is substantially surrounded by the dielectric layer, wherein a portion of the mushroom-shaped solder bump covering the dielectric layer.

9. The method as claimed in claim 8, wherein the conductive layer comprises tin.

10. The method as claimed in claim 8, wherein the dielectric layer comprises light sensitive polymer.

11. The method as claimed in claim 8, wherein the dielectric layer comprises polyimide.

12. The method as claimed in claim 8, wherein the resist layer comprises a city film.

13. The method as claimed in claim 8, wherein the resist layer comprises a wet photoresist layer.

14. The method as claimed in claim 8, wherein the first and second openings constitute a T-shaped opening.

15. The method as claimed in claim 8, wherein the portion of the mushroom-shaped solder bump has a thickness of about 15% to 20% of the total thickness thereof.

* * * * *